(12) United States Patent
Lenert et al.

(10) Patent No.: US 11,569,777 B2
(45) Date of Patent: Jan. 31, 2023

(54) THIN-FILM THERMOPHOTOVOLTAIC CELLS

(71) Applicant: The Regents of the University of Michigan, Ann Arbor, MI (US)

(72) Inventors: Andrej Lenert, Ann Arbor, MI (US); Stephen R. Forrest, Ann Arbor, MI (US); Tobias Eugene Burger, Ann Arbor, MI (US); Deiju Fan, Ann Arbor, MI (US); Kyusang Lee, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 150 days.

(21) Appl. No.: 16/455,015

(22) Filed: Jun. 27, 2019

(65) Prior Publication Data

US 2020/0007069 A1 Jan. 2, 2020

Related U.S. Application Data

(60) Provisional application No. 62/691,194, filed on Jun. 28, 2018.

(51) Int. Cl.
*H02S 10/30* (2014.01)
*H01L 31/0304* (2006.01)
*H01L 31/0216* (2014.01)
*H01L 31/056* (2014.01)

(52) U.S. Cl.
CPC ........ *H02S 10/30* (2014.12); *H01L 31/02168* (2013.01); *H01L 31/03046* (2013.01); *H01L 31/056* (2014.12)

(58) Field of Classification Search
CPC ............. H01L 31/056; H01L 31/03046; H01L 31/02168; H02S 10/30; H02S 40/44
USPC .................................................. 136/243–265
See application file for complete search history.

(56) References Cited

U.S. PATENT DOCUMENTS

| | | | | |
|---|---|---|---|---|
| 4,234,352 | A | * 11/1980 | Swanson | H02S 10/30 136/253 |
| 5,700,332 | A | 12/1997 | Brown | |
| 5,753,050 | A | 5/1998 | Charache | |
| H1856 | H | * 9/2000 | Baldasaro | H02S 40/44 136/258 |
| 6,162,987 | A | * 12/2000 | Murray | H01L 31/056 136/249 |
| 7,166,797 | B1 | * 1/2007 | Dziendziel | H02S 10/30 136/253 |
| 9,660,117 | B1 | 5/2017 | Dimmock | |

OTHER PUBLICATIONS

Wanlass et al, High-performance, 0.6 eV, Ga0.32In0.68As/InAs0.32P0.68 thermophotovoltaic converters and monolithically interconnected modules, 1999, AIP Conference Proceedings 460, 132-141. (Year: 1999).*

(Continued)

*Primary Examiner* — Andrew J Golden
(74) *Attorney, Agent, or Firm* — Lempia Summerfield Katz LLC

(57) ABSTRACT

Thermophotovoltaic (TPV) systems and devices with improved efficiencies are disclosed herein. In one example, a thermophotovoltaic (TPV) cell includes an active layer; a back-surface reflective (BSR) layer; and a spacer layer positioned between the active layer and back-surface reflective layer.

26 Claims, 5 Drawing Sheets

200 Thermophotovoltaic Cell

| 202 Anti-reflective Coating |
|---|
| 204 Active Region/Layer |
| 206 Spacer Layer |
| 208 Back Surface Reflective Layer |

(56) References Cited

OTHER PUBLICATIONS

Wu et al., A study of contacts and back surface-surface reflectors for 0.6 eV Ga0.32In0.68As/InAs0.32P0.68 thermophotovoltaic monolithically interconnected modules, 1999, AIP Conference Proceedings 460, 517-524. (Year: 1999).*
Harder et al, Theoretical limits of thermophotovoltaic solar energy conversion, 2003, Semicond. Sci. Technol. 18 S151-157. (Year: 2003).*
Baldasaro et al, Thermodynamic analysis of thermophotovoltaic efficiency and power density tradeoffs, 2001, Journal of Applied Physics 89, 3319-3327. (Year: 2001).*
Scranton et al, Highly Efficient Thermophotovoltaics Enabled by Photon Re-Use, In 2016 IEEE 43rd Photovoltaic Specialists Conference (PVSC) (pp. 1026-1029). IEEE (Year: 2016).*
Ganapati et al, Ultra-efficient thermophotovoltaics exploiting spectral filtering by the photovoltaic band-edge, 2016, arXiv preprint arXiv:1611.03544. (Year: 2016).*
Charache et al., "Thermophotovoltaic Devices Utilizing a Back Surface Reflector for Spectral Control", AIP Conference Proceedings, 1996, pp. 339-350.
Huang et al., "Hybrid Back Surface Reflector GaInAsSb Thermophotovoltaic Devices", AIP Conference Proceedings, Dec. 2004, 8 pages, vol. 738.
Su et al., "Characterization and Modeling of InGaAs/InAsP Thermophotovoltaic Converters Under High Illumination Intensities", Journal of Applied Physics 101, 064511, 2007, 6 pages.
United States Statutory Invention Registration No. H1,856, published Sep. 5, 2000, US.
Wang et al., "Wafer-Bonded Internal Back-Surface Reflectors for Enhanced TPV Performance", Thermophotovoltaic Generation of Electricity: 5th Conference, 2003, pp. 473-481.
Ackley et al., "Silicon Films as Selective Absorbers for Solar Energy Conversion," Appl. Opt. 1977, 16 (11), 2806-2809.
B. Wernsman et al., "Greater than 20% radiant heat conversion efficiency of a thermophotovoltaic radiator/module system using reflective spectral control," in IEEE Transactions on Electron Devices, vol. 51, No. 3, pp. 512-515, Mar. 2004.
Bermel et al. "Design and Global Optimization of High-Efficiency Thermophotovoltaic Systems." Optics Express 18, No. 103 (Sep. 13, 2010): A314-34.
Booth et al., "Stabilized CVD Amorphous Silicon for High Temperature Photothermal Solar Energy Conversion." Sol. Energy Mater. 1979, 2 (1), 107-124.
Clevenger et al, "Optical Properties of Thin Semiconductor Device Structures with Reflective Back-Surface Layers." AIP Conference Proceedings 460, No. 1 (Mar. 10, 1999): 327-34.
Fernandez et al., "Back-surface Optimization of Germanium TPV Cells," AIP Conference Proceedings 890, 190 (2007).
Moon et al., "High Performance Multi-Scaled Nanostructured Spectrally Selective Coating for Concentrating Solar Power." Nano Energy 2014, 8, 238-246.
Omair et al. "Ultraefficient thermophotovoltaic power conversion by band-edge spectral filtering," Proc. Natl. Acad. Sci. USA 116, 15356-15361 (2019).
Ringel et al, "Growth and Properties of InGaAs/FeAl/InAlAs/InP Heterostructures for Buried Reflector/Interconnect Applications in InGaAs Thermophotovoltaic Devices." AIP Conference Proceedings 460, No. 1 (Mar. 10, 1999): 142-51.
Seyf et al., "Thermophotovoltaics: A Potential Pathway to High Efficiency Concentrated Solar Power," Energy & Environmental Science, Jul. 4, 2016.
Swanson, "Recent developments in thermophotovoltaic conversion," 1980 International Electron Devices Meeting 186-189 (IRE, 1980).
Swanson, "Recent developments in thermophotovoltaic conversion," Photovoltaic Solar Energy Conference, p. 1097 (1980).
Thomas et al., "Semiconductor-Based Multilayer Selective Solar Absorber for Unconcentrated Solar Thermal Energy Conversion." Scientific Reports 7, No. 1 (Jul. 13, 2017): 5362.
Tong et al., "Thin-Film 'Thermal Well' Emitters and Absorbers for High-Efficiency Thermophotovoltaics," Scientific Reports 5 (Jun. 1, 2015).
Wang et al, "Monolithically Series-Interconnected GaInAsSb/AlGaAsSb/GaSb Thermophotovoltaic Devices with an Internal Backsurface Reflector Formed by Wafer Bonding." Applied Physics Letters 83, No. 7 (Aug. 12, 2003): 1286-88.
Wang et al., "Wafer bonding and epitaxial transfer of GaSb-based epitaxy to GaAs for monolithic interconnection of thermophotovoltaic devices," Journal of Electronic Materials vol. 33, pp. 213-217 (2004).
Wu et al., "A Study of Contacts and Back-Surface Reflectors for 0.6-EV Ga0.32In0.68As/InAs0.32P0.68 Thermophotovoltaic Monolithically Interconnected Modules." AIP Conference Proceedings 460, No. 1 (Mar. 10, 1999): 517-24.

* cited by examiner

100 Thermophotovoltaic System

200 Thermophotovoltaic Cell

| |
|---|
| 202 Anti-reflective Coating |
| 204 Active Region/Layer |
| 206 Spacer Layer |
| 208 Back Surface Reflective Layer |

THIN-FILM THERMOPHOTOVOLTAIC CELLS

This application claims the benefit of U.S. Provisional Patent Application No. 62/691,194, filed on Jun. 28, 2018, which is hereby incorporated by reference in its entirety.

TECHNICAL FIELD

The present disclosure generally relates to thermophotovoltaic systems and devices, and, in particular, thin film layers in thermophotovoltaic devices and systems.

BACKGROUND

Thermophotovoltaic (TPV) energy conversion refers to a process in which thermal energy in the form of heat is converted to electrical energy. Thermophotovoltaics are solid-state devices for scalable electricity generation from a variety of high-temperature heat sources. TPVs relate to the application of photovoltaic diodes to harvest electricity from thermal radiation.

This is achieved through the use of appropriately designed thermal emitters which are typically heated to temperatures of more than 600° C. Operating ranges are generally in the range of 900° C. to 1600° C. TPVs include, at a minimum, a thermal emitter and a photovoltaic (PV) cell (e.g., a low-bandgap PV cell) in close proximity. The TPV system may also include additional components such as concentrators, filters, and reflectors.

The merits of thermophotovoltaics include the prospect of delivering high power density compared to solar photovoltaics, fuel versatility, portability and capability of around-the-clock operation. In particular, the scalability of TPVs makes them a promising alternative to turbines for small-scale (e.g., ~10 kW) energy conversion such as distributed co-generation of heat and power. The technology also has the potential for integration with high-temperature thermal energy storage, a technique that could help regulate power supply in concentrated solar power schemes.

Challenges to commercialization of TPV technology include low heat-to-electricity conversion efficiency, thermostructural reliability at high temperatures, and cost.

Thin-film TPV cells (e.g., a few microns thick) have the potential to enable selective radiative transfer by reducing the optical path length through the cell and leveraging thin-film interference. Thin-film cells may also exhibit lower rates of radiative recombination.

Spectrally selective techniques have led to improved performance in conventional III-V TPVs where the active layer is on a growth substrate that exceeds 10 μm in thickness. They can be broadly categorized as either emission control or absorption control. In particular, suppression of sub-bandgap radiative transfer provides improvements in efficiency. Studies have utilized nanophotonic emitters to selectively emit radiation above the PV cell bandgap. However, TPV systems relying only on emission control are limited by decreased selectivity of emitters at high operating temperatures. Further, the long-term thermal stability of nanostructured emitters has yet to be addressed.

Alternatively, PV cells exhibiting selective absorption have facilitated recycling of low-energy photons, and consequently, improved efficiency. This approach makes use of a cell with a back surface reflector (BSR) or a front surface filter (FSF) to reflect the majority of radiation with energy lower than the semiconductor bandgap, while absorbing radiation with higher energies. Low-energy photons reflected by the cell are re-absorbed by the thermal emitter, decreasing net heat transfer between the emitter and cell (Qh) without decreasing output power. An early demonstration of selective absorption in a Si cell reached a thermal-to-electrical conversion efficiency of 26% for an emitter temperature of 2300 K. Utilization of lower bandgap cells has enabled similar efficiencies at moderate temperatures. Siergiej, et al. utilized an InGaAs cell with an Au BSR and a $Si_3N_4$ anti-reflection coating (ARC) to achieve an efficiency of 20.6% for a 1330 K emitter. This device was later modified to include a FSF, increasing its efficiency to 23.6%. However, the spectral-selectivity of these approaches has been limited by parasitic absorption of sub-bandgap radiation due to a variety of possible mechanisms including absorption in the wafer, the thickest layer of the cell (hundreds of microns).

As such, there remains a need to develop a TPV device or system with an improved thermal-to-electrical conversion efficiency and power output.

SUMMARY

Thermophotovoltaic cells and their compositions are described herein. In one or more embodiments, a thermophotovoltaic (TPV) cell includes an active layer, a back-surface reflective (BSR) layer, and a spacer layer positioned between the active layer and back-surface reflective layer, wherein the active layer includes indium gallium arsenide and no antimonide or only trace levels of antimonide.

In another embodiment, the TPV cell includes an active layer, a back-surface reflective (BSR) layer, a spacer layer positioned between the active layer and back-surface reflective layer, wherein a thickness of the spacer layer is in a range of 0.01-1 micrometers.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DESCRIPTION OF THE DRAWING FIGURES

For a more complete understanding of the disclosure, reference is made to the following detailed description and accompanying drawing figures, in which like reference numerals may be used to identify like elements in the figures.

Figures 1, 2:
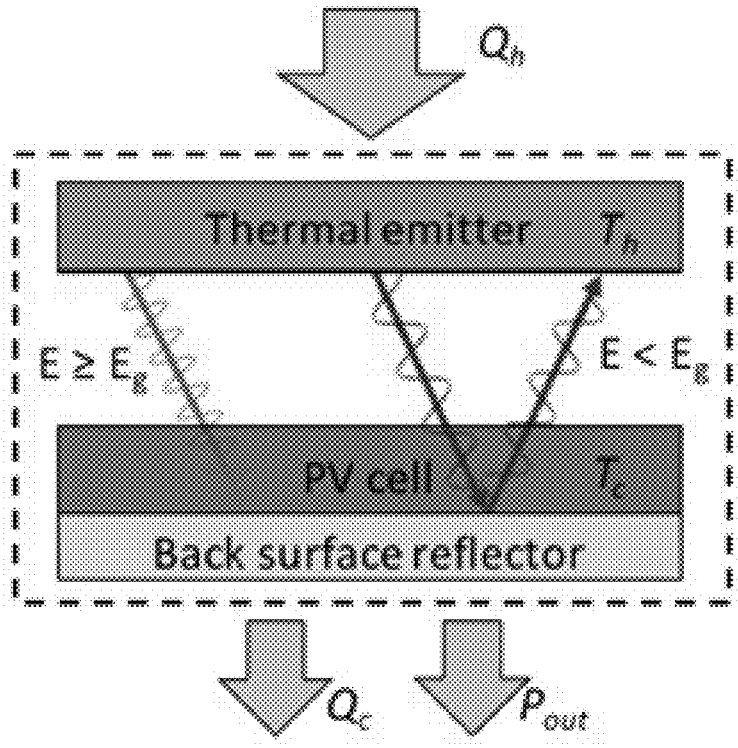
FIG. 1 depicts an example of a thermophotovoltaic system having a thermal emitter and thermophotovoltaic cell.
FIG. 2 depicts an example of a thermophotovoltaic cell having an anti-reflective coating (ARC) layer, an active region/layer, a spacer layer, and a back surface reflective (BSR) layer.

While the disclosed devices and systems are representative of embodiments in various forms, specific embodiments are illustrated in the drawings (and are hereafter described), with the understanding that the disclosure is intended to be illustrative and is not intended to limit the claim scope to the specific embodiments described and illustrated herein.

DETAILED DESCRIPTION

Various non-limiting examples of thin-film TPV devices and systems are described in greater detail below.

In certain examples, to achieve high conversion efficiency in TPV devices and systems, the transport of sub-bandgap radiation between the thermal emitter and a PV cell is suppressed. Selective absorption in the TPV cell to facilitate recycling of sub-bandgap radiation is described herein. High levels of absorptive spectral-selectivity in thin-film active layer (e.g., InGaAs) structures with a back-surface reflector (BSR) fabricated using epitaxial growth and lift-off. Strategies for enhancing the selectivity of InGaAs thin films using dielectric coatings that clad the active layer are also disclosed. The optical properties of the structures agree with simulations, achieving weighted reflectance as high as 96% below the bandgap. Based on a model for radiative transport and energy conversion in parallel plate TPVs with a 1500 K blackbody emitter, an optimized thin-film cell may achieve a thermal-to-electrical conversion efficiency of 52% and a power output of 2.1 W/cm$^2$, which is substantially higher than current TPV devices.

Definitions

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, "trace levels" may refer to an element or compound being present at a concentration level (e.g., mole or mass fraction) within a defined composition (e.g., a layer of the TPV cell) that is very low. For example, the trace level may refer to an atomic element [e.g., antimonide (Sb)] being present in the active layer at a concentration level of less than 0.5 mol % Sb, less than 1000 parts per million, or less than 100 parts per million.

Thermophotovoltaic Systems and Cells

FIG. 1 depicts an example of a thermophotovoltaic system 100. The system 100 includes a thermal emitter ($T_h$) and a thin-film device having a photovoltaic cell ($T_a$) and a back surface reflective layer.

As shown in FIG. 1, energy flows in a parallel plate TPV system with a sub-bandgap photon recycle. Spectrally selective adsorption is achieved in the thin-film cell with a back-surface reflector (BSR), therein decreasing waste heat ($Q_c$) and net heat transfer between the emitter and cell ($Q_h$) without decreasing output power ($P_{out}$).

During TPV operation shown in FIG. 1, input heat ($Q_h$) increases the temperature of the emitter ($T_h$) and drives thermal emission ($Q_{emit}$). The photon flux of an emitting blackbody, ϕ, as a function of emitted photon energy, E, is calculated via Planck's Law:

$$\Phi(E) = \frac{2\pi E^2}{c^2 h^3 \left(\exp\left(\frac{E}{k_B T}\right) - 1\right)} \quad (1)$$

where c is the speed of light, h is Planck's constant, and $k_B$ is the Boltzmann constant. Radiation emitted by the thermal emitter, $\phi_h(E)$, is described by Planck's Law evaluated at $T_h$.

A portion of incident radiation is absorbed by the PV cell and the rest is reflected ($Q_{ref}$). Hemispherically-averaged absorptance ($\alpha(E)$) is calculated by integration of the angle-dependent absorption spectrum ($\alpha(E,\theta)$) over angles ($\theta,\phi$):

$$a(E) = \frac{\int_0^{2\pi} \int_0^{\pi/2} a(E, \theta) \cos(\theta) \sin(\theta) d\theta d\phi}{\int_0^{2\pi} \int_0^{\pi/2} \cos(\theta) \sin(\theta) d\theta d\phi} \quad (2)$$

Upon absorption in the active layer of the PV cell, above-bandgap photons generate excited electron-hole pairs, enabling the extraction of electrical power ($P_{out}$).

The maximum short circuit current is calculated from the angle-averaged optical response, $\alpha(E)$, and the emitted photon flux, $\phi_h(E)$, viz.:

$$J_{SC} = q\int_{E_g}^{\infty} a(E)\Phi_h(E)dE \quad (3)$$

where q is the elementary charge of an electron and $E_g$ is the bandgap.

The photocurrent, J, as a function of voltage across the cell, V, is the difference between the short circuit current and recombination loss, given by:

$$J(V) = J_{sc} - q(R_{rad} + R_{SRH} + R_{Aug}) \quad (4)$$

where $R_{rad}$, $R_{SRH}$, and $R_{Aug}$, are the radiative, Shockley-Reed-Hall (SRH), and Auger recombination rates, respectively.

The radiative recombination rate is:

$$R_{rad} = \exp\left(\frac{qV}{k_B T_c}\right) \int_{E_g}^{\infty} a(E)\Phi c(E)dE \quad (5)$$

In the case of low semiconductor doping concentration ($N_D$), such that the injected carrier concentration ($n_o$) is greater than $N_D$, the non-radiative recombination rates are independent of dopant concentration. In this regime, the non-radiative SRH recombination rate is:

$$R_{SRH} = \frac{Ln_i^2}{\tau_{SRH}} \exp\left(\frac{qV}{k_B T_c}\right) \quad (6)$$

where L is the thickness of the active region, $\tau_{SRH}$ is the SRH recombination lifetime, and $n_i$ is the intrinsic carrier concentration.

Literature values of intrinsic carrier concentration and SRH lifetime for an active layer including InGaAs at 300 K are $6.3 \times 10^{11}$ cm$^{-3}$ and 47.4 µs, respectively. The non-radiative, Auger recombination rate, $R_{Aug}$, is:

$$R_{Aug} = L(C_n + C_p)n_i^3 \exp\left(\frac{3qV}{2k_B T_c}\right) \quad (7)$$

where $C_n$ and $C_p$ are the Auger recombination coefficients for recombination involving two electrons and two holes, respectively. The Auger recombination coefficients are $C_n = C_p = 8.1 \times 10^{-29}$ cm$^{-3}$.

The output power of the cell is the product of the photocurrent and the voltage:

$$P_{out} = J(V) \cdot V \quad (8)$$

Efficiency is calculated from the maximum power point voltage, $V_{MPP}$, and current response, $J_{MPP}$ via:

$$\eta_{TPV} = \frac{P_{out}}{Q_h} = \frac{P_{out}}{Q_{emit} - Q_{ref}} = \frac{J_{MPP} \cdot V_{MPP}}{\int_0^\infty E \cdot \Phi_h(E) dE - \int_0^\infty (1 - a(E)) \cdot E \cdot \Phi_h(E) dE} \quad (9)$$

As depicted in FIG. 1, the thermal emitter ($T_h$) in the TPV system 100 may include polycrystalline silicon carbide (SiC), a refractory metal such as tungsten, a rare-earth oxide such as ytterbium oxide (Yb$_2$O$_3$) or erbium oxide (Er$_2$O$_3$), photonic crystals such as tungsten photonic crystals, or combinations thereof.

In addition to a back-surface reflective layer, the thin-film thermophotovoltaic cell may include additional layers or compositions that may improve the efficiency of the device or system while maintaining output power.

For example, the various compositions or molecules within a thermophotovoltaic cell may include one or more of: an anti-reflective coating layer, an active layer, a spacer layer, and a back surface reflective layer.

FIG. 2 depicts an example of a thermophotovoltaic cell 200. As depicted in FIG. 2, the thermophotovoltaic cell 200 includes, at the front of the cell, an anti-reflective coating (ARC) layer 202. The cell 200 also includes an active layer 204 positioned adjacent to the ARC layer 202. The cell 200 further includes a spacer layer 206 positioned adjacent to the active layer 204. Additionally, the cell 200 includes, at its back-end, a back-surface reflective layer 208 positioned adjacent to the spacer layer 206.

In some examples, intermediate layers may be positioned between the ARC layer 202 and active layer 204, between the active layer 204 and spacer layer 206, and/or between the spacer layer 206 and the BSR layer 208. Further, in other examples, additional layers may be positioned on the front or back surfaces of the cell, (e.g., adjacent to the ARC layer 202 and/or adjacent to the BSR layer 208).

The various layers or compositions that may be within a thin-film thermophotovoltaic cell are described in greater detail below.

Anti-Reflective Coating (ARC) Layer

The anti-reflective coating (ARC) layer may be one or more transparent dielectric compositions or layers configured to reduce the reflection of light passing through the surface of the layer, including, but not limited to, oxides, fluorides, chalcogenides, and certain polymers. In some examples, the ARC layer may include one or more of magnesium fluoride (MgF$_2$), a fluoropolymer composition, silica compositions (such as mesoporous silica), zinc selenide (ZnSe), or titanium dioxide (TiO$_2$). In certain examples, the ARC layer includes a plurality of layers. In one example, the plurality of layers includes a layer including MgF$_2$ and a layer including ZnSe. ARC layers may also include gradient index (GRIN) materials and nanostructured surfaces.

In the thin-film thermophotovoltaic cell, the thickness of the overall ARC layer or plurality of ARC layers may be in a range of 0.01-10 micrometers (µm), 0.1-1 µm, or 0.1-0.5 µm.

Additionally, to the extent the ARC layer includes a plurality of layers, each individual layer may have a thickness in a range of 0.01-5 micrometers (µm), 0.1-0.5 µm, or 0.1-0.3 µm.

Active Layer(s)

The active layer in the TPV cell may refer to a single-junction or a multi-junction cell. In other words, as disclosed herein, an active layer may refer to one or more active layers within the TPV cell.

In certain examples, the active layer includes a direct bandgap semiconductor composition. The active layer may include a group III-V or group IV semiconductor. In certain examples, the active layer may include silicon, germanium, gallium antimonide (GaSb), indium arsenide (InAs), gallium arsenide (GaAs), indium phosphide (InP), indium gallium arsenide antimonide (InGaAsSb), indium gallium arsenide (InGaAs), indium phosphide arsenide antimonide (InPAsSb), or indium gallium arsenide phosphide (InGaAsP). In certain examples, the active layer does not include antimonide (Sb) (i.e., the active layer is antimonide-free). In one particular example, the active layer includes InGaAs and no Sb or only trace levels of Sb. The lack of more than trace levels of antimonide may be advantageous in being able to provide a lower dark current density cell and, in some examples, improve the overall efficiency of the TPV cell over a similarly constructed TPV cell with more than trace amounts of antimonide present in the active layer.

The thickness of the active layer may be in a range of 0.01-10 micrometers (µm), 0.1-5 µm, or 1-3 µm.

Spacer Layer

The spacer layer is positioned between the active layer and the back surface reflector. The spacer layer may be configured to improve the overall efficiency of the thermophotovoltaic cell.

In certain examples, the spacer layer includes an insulating composition or material with a low refractive index (e.g., the spacer is a dielectric spacer). For example, the refractive index of the spacer layer may be a value that is less than the refractive index of the active layer. In some examples, the refractive index of the spacer layer may be less than 3.5.

In one particular example, the spacer layer includes magnesium fluoride (MgF$_2$). In another example, the spacer may include one or more of a fluoropolymer composition, silica compositions (such as mesoporous silica), zinc sulfide (ZnS), zinc selenide (ZnSe), or titanium dioxide ($TiO_2$).

The thickness of the spacer layer may be 0.01-1 micrometers (μm), 0.1-1 μm, 0.1-0.5 μm, or 0.1-0.3 μm. The thickness of the spacer layer being on the scale of the wavelength in the medium (e.g., approximately 500 nanometers) is surprisingly advantageous in being able to improve the overall efficiency of the TPV cell. The spacer layer may be advantageous in decreasing the amount of parasitic absorption and radiative recombination, and/or improving photocurrent and voltage. The spacer layer may also be advantageous in allowing one to optimize the interference peaks.

Back Surface Reflective (BSR) Layer

The back surface reflector (BSR) or reflective layer may be a composition configured to reflect sub-bandgap photons that are not absorbed by the active layer and redirect them back toward the thermal emitter.

The BSR may include a metal or an alloy thereof. For example, in some embodiments, the metal is a low electrical resistivity material such as copper (Cu), silver, aluminum, or gold. In one particular example, the BSR includes gold or an alloy thereof. In another example, the BSR includes silver or an alloy thereof.

The BSR may include a dielectric stack, such as a Bragg reflector.

The thickness of the BSR layer may be 0.01-10 micrometers (μm), 0.1-5 μm, 0.1-1 μm, or 0.1-0.5 μm.

Adhesion Layer

The TPV cell may also include an adhesion layer configured to adhere the BSR and Spacer layers to substrate and absorbing layer (e.g., a silicon wafer). In certain examples, the adhesion layer includes a transition metal such as iridium (Ir), Platinum (Pt), or titanium (Ti).

Examples of TPV Cells

Figure 3A:
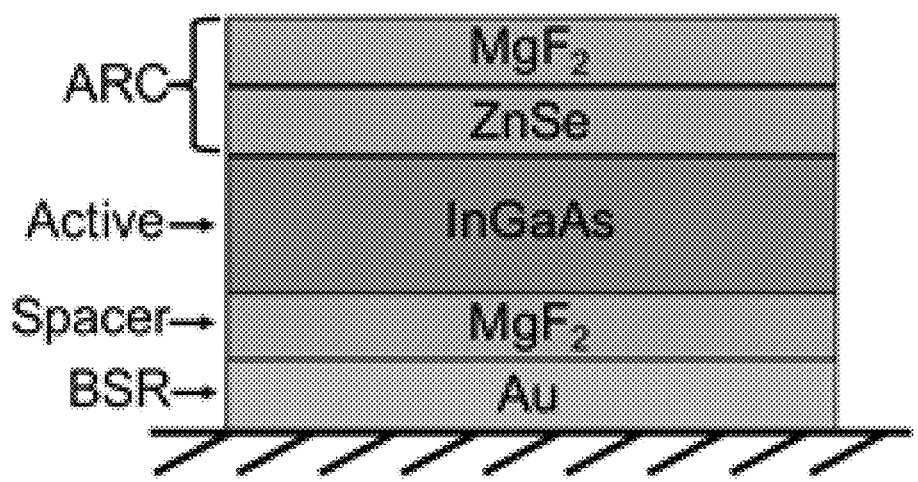
FIG. 3A depicts an additional example of a thermophotovoltaic cell having an ARC layer including $MgF_2$ and ZnSe, an InGaAs active layer, a $MgF_2$ spacer layer, and a gold BSR layer.

FIG. 3A depicts an additional example of a thermophotovoltaic cell 300. As depicted in FIG. 3A, the thermophotovoltaic cell 300 includes, at the front of the cell, an anti-reflective coating (ARC) having a plurality of layers. The ARC includes a first, outer layer including $MgF_2$. The $MgF_2$ layer is approximately 190 nanometers (nm) thick. The ARC also includes a second, inner layer including ZnSe. The ZnSe layer is approximately 110 nm thick.

The cell 300 also includes an active layer having InGaAs. The active layer is approximately 1.3 μm thick. The cell 300 further includes a spacer layer having $MgF_2$. Additionally, the cell 300 also includes, at its back-end, a back-surface reflective layer having gold. The BSR layer is approximately 400 nm thick.

Figure 3B:
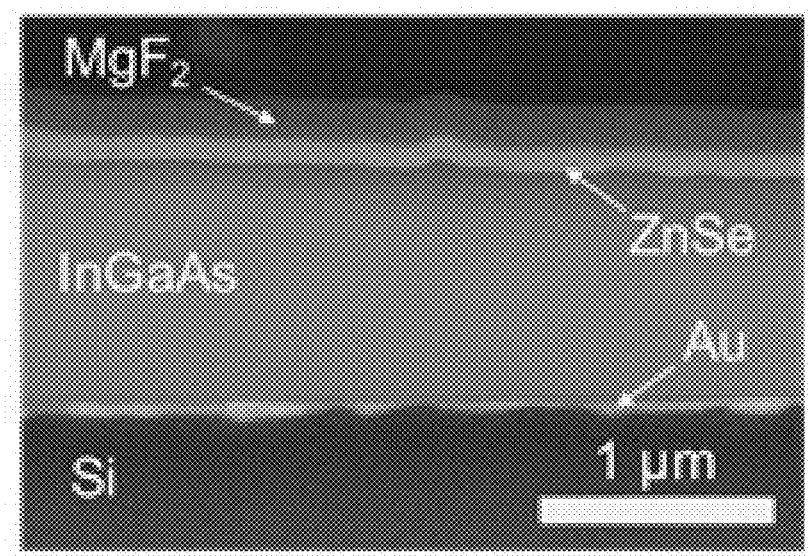
FIG. 3B depicts a cross-sectional image of the thermophotovoltaic cell.

FIG. 3B depicts a cross-sectional image of a thermophotovoltaic cell, showing the various thicknesses of the cell layers.

Performance Characteristics and End Use Applications

In certain examples, the TPV cell may have a conversion efficiency ($\eta_{TPV}$) of at least 45%, at least 50%, at least 51%, at least 52%, in a range of 45-55%, in a range of 50-52%, or in a range of 51-52%.

The TPV cell may also have a power output ($W/cm^2$) of at least 1.5 $W/cm^2$, at least 1.8 $W/cm^2$, at least 1.9 $W/cm^2$, at least 2 $W/cm^2$, at least 2.1 $W/cm^2$, in a range of 1.8-2.1 $W/cm^2$, in a range of 1.8-2.1 $W/cm^2$, or in a range of 2-2.1 $W/cm^2$.

The TPV cell may also have a sub-bandgap reflectance of at least 90%, at least 95%, at least 96%, or at least 97%.

As discussed herein, the thin-film layers disclosed above may be used in the development of thermophotovoltaic power cells. Specifically, the technology could potentially provide thermophotovoltaic cells that are efficient enough to actually be commercially viable.

These power cells are potentially useful in improved solar generators and panels. The theoretical efficiency of the proposed device exceeds the efficiency of even the most advanced photovoltaic solar panels and appears to have a dramatically higher power output per $cm^2$. If the device may be produced at scale and relatively affordably, the technology could be paired with solar concentrators for heat generation to provide renewable energy more efficiently using smaller physical footprints.

The power cells could also be used in mobile power generation. The technology is heat-source agnostic, so heat generated by solar radiation or the combustion of fuels like butane allow the generation of power in remote, off-grid locations. In particular, electricity generation can be coupled to heat generation, which makes the technology particularly attractive in cold climates. The power cells could also be useful in natural-disaster response or military operations. In particular, the silent operation of these power cells may make them well-adapted to battlefield applications.

In another example, the power cells could be used as "nuclear batteries." Thermoelectric power generators are common in spacecraft such as interplanetary probes. These devices pair thermal energy from the radioactive decay of elements like plutonium to materials that convert heat to electricity directly. Given the high efficiency and power output of the proposed technology, it could potentially provide next-generation nuclear batteries for these applications.

The power cells could also be implemented in waste heat power recycling. Coupling TPV generators to sources of significant waste heat, such as in manufacturing facilities, could allow for the recycling in some of that energy and the efficient production of electrical energy that could subsidize production costs related to energy requirements.

Methods of Making

The TPV cell may be fabricated using an epitaxial growth and lift-off process. This may include growing a sacrificial layer on a substrate or wafer, bonding the thin-film TPV cell having the active layer to the back-surface reflective layer coated to the wafer, and then removing the wafer by epitaxial lift-off. An example of the process is described in the Example section below.

EXAMPLES

Optical Properties of Thin-Film InGaAs Structures

Various TPV cells were fabricated and characterized. In one example, a 1.38 μm thick epitaxial layer of InGaAs was positioned on a gold (Au) BSR, (hereafter called "BSR"). In this example, a 4 nm AlAs sacrificial layer was grown by molecular beam epitaxy on a (100) InP wafer, followed by the InGaAs epitaxial layer. The thin film was cold-weld bonded to an Au-coated Si wafer and removed from the InP wafer by epitaxial lift-off. Optical modeling via the transfer matrix method is used to simulate the absorptance (a) of the BSR structure as a function of incident photon energy (E) and incidence angle (θ). Optical properties for each material considered in this study are based on literature values.

Figure 4A:
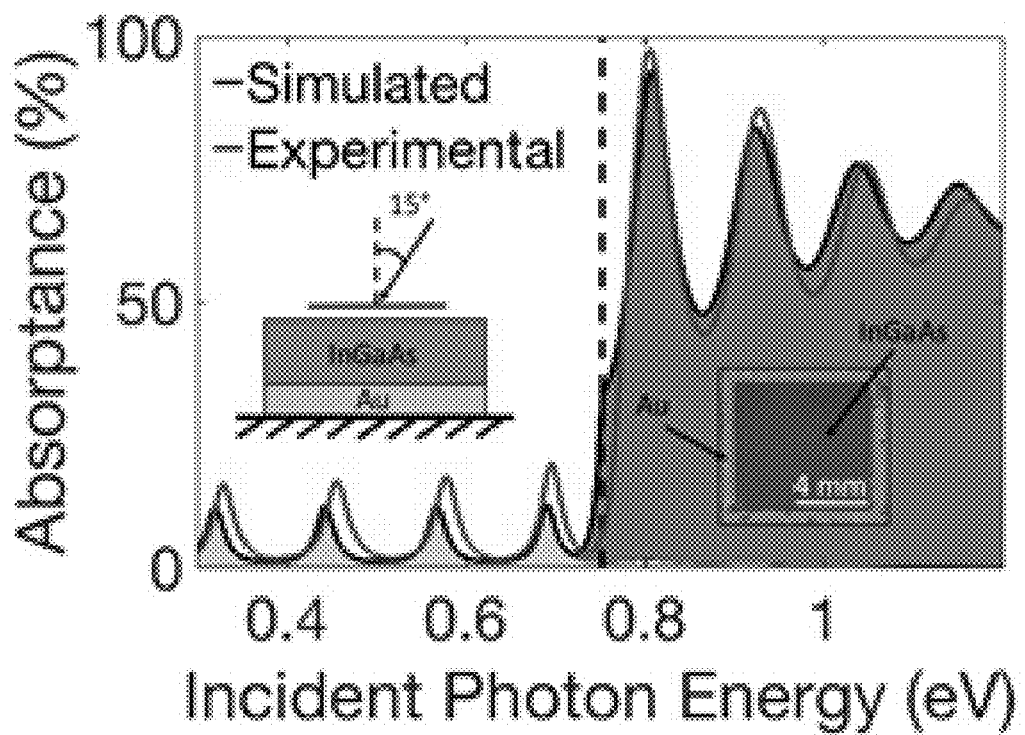
FIG. 4A depicts simulated and experimental results for optical responses of a back surface reflective layer of a thermophotovoltaic cell.

The simulated optical response is compared to experimental optical response measured by a Fourier transform infrared (FT-IR) microscope (see FIG. 4A). All experimental layer thicknesses are estimated from their growth rate during fabrication; fine thickness adjustments (<10% of layer thickness), within the range of uncertainty from the growth rate estimation, were made using a least squares regression comparing the simulated to the experimental optical response. The response is characterized by selective absorptance above the material bandgap. The experimentally-demonstrated response exhibits an average absorptance of 61% above the bandgap by the active InGaAs layer, and 5.5% below the bandgap. The simulated optical absorptance agrees with experiment within 2.5%. The model also captures the observed oscillatory interference variations in absorptance.

Figure 4B:
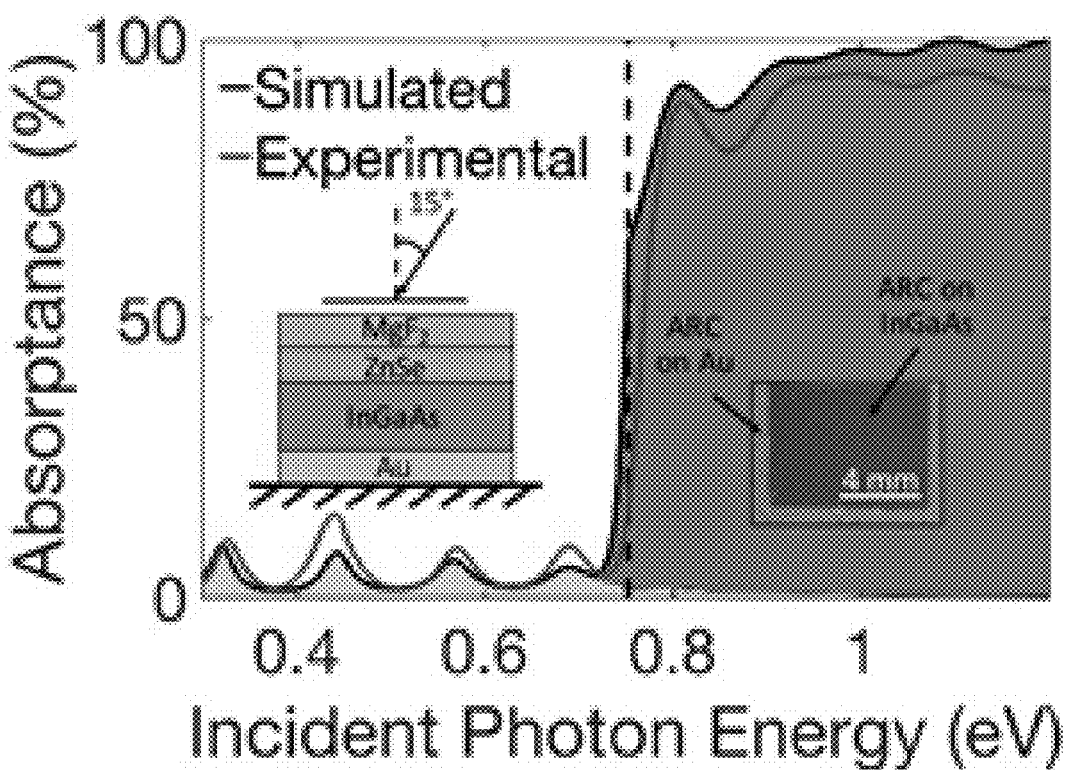
FIG. 4B depicts simulated and experimental results for optical responses of an anti-reflective coating layer of a thermophotovoltaic cell.

To improve the spectral properties of the structure, specifically to increase the above-bandgap absorption, a double layer ARC (190 nm $MgF_2$, 100 nm ZnSe) was positioned on a 1.31 μm InGaAs cell with an Au BSR (herein called "ARC"). The optical response is characterized by a pronounced increase in absorptance above the bandgap compared to the BSR structure and a reduction of peak-to-peak absorptance variations (see FIG. 4B). On average, the experimental optical response exhibits absorptance of 81% above the bandgap and maintains 5.3% absorptance below the bandgap, in agreement with the model. An absorptance peak is observed at 0.44 eV that is attributed to parasitic absorption in the double-layer ARC, as confirmed by measurement of the ARC directly on Au.

Figure 4C:
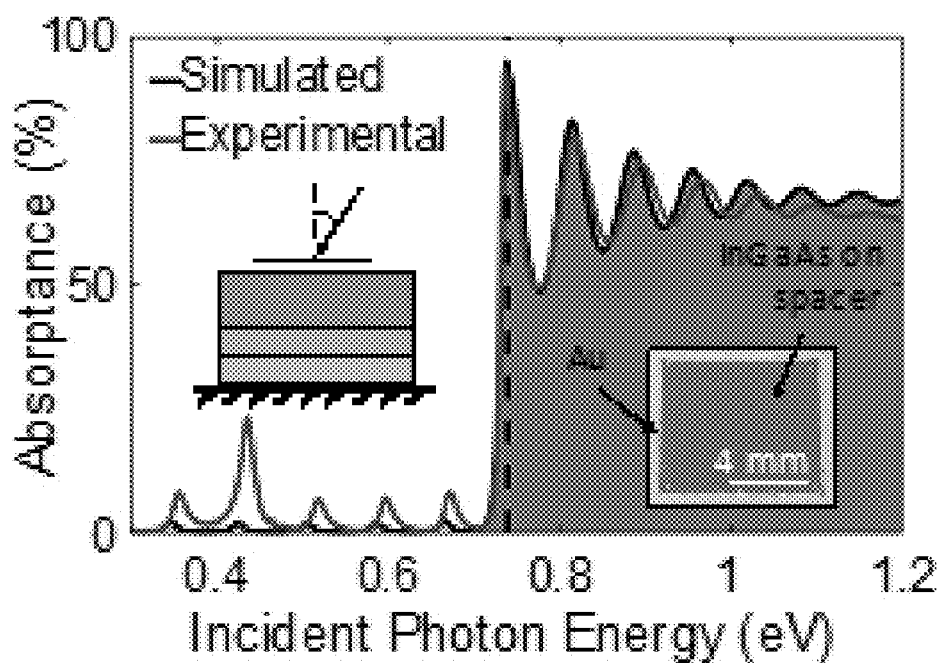
FIG. 4C depicts simulated and experimental results for optical responses of a spacer layer of a thermophotovoltaic cell.

While an ARC improves above-bandgap coupling, high sub-bandgap reflectance is required for high-efficiency TPV cells. In one example, an alternative structure, utilizing a 430 nm thick $MgF_2$ spacer between a 2.1 μm thick InGaAs and the Au BSR to enhance sub-bandgap reflectance. The InGaAs—$MgF_2$—Au structure, (hereafter called "Spacer"), exhibits an average sub-bandgap absorptance of 4% (see FIG. 4C), e.g., a 96% average sub-bandgap reflectance, better than the previous two structures described. However, this structure has a relatively low above-bandgap absorptance (62.5% average).

The simulated optical response of each of the architectures agrees with their respective, measured response within 9% above the bandgap and 5% below the bandgap.

Optimization of TPV Systems

The layer thicknesses of the three structures were varied (BSR, ARC, and Spacer) to maximize the conversion efficiency (see Equation 9). The performance of the optimized cell structures (see Table 1 below) is compared with an InGaAs cell with no BSR (hereafter called "Baseline"), characterized by a Beer-Lambert absorptance profile and no spectral selectivity. The thickness of the InGaAs layer was set in the Baseline structure to twice that of the BSR case, such that the optical path lengths through InGaAs are approximately equal.

Figure 5A:
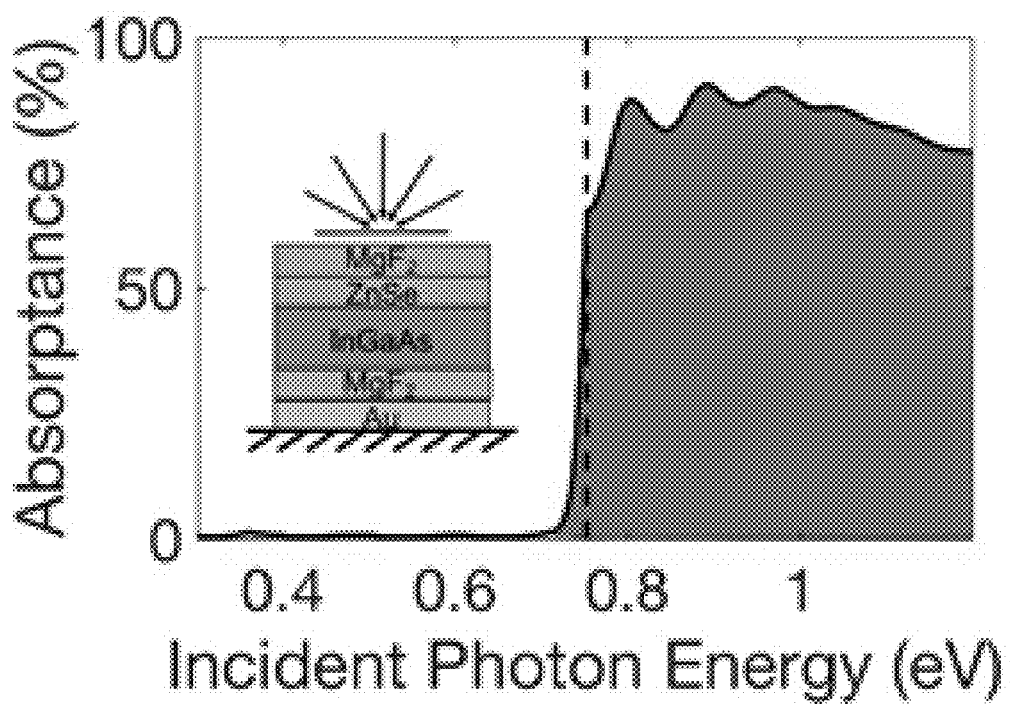
FIG. 5A depicts a calculated, hemispherically-averaged optical response of for the combined layers of a thermophotovoltaic cell including an anti-reflective coating layer, an active region/layer, a spacer layer, and a back surface reflective (BSR) layer.
Figure 5B:
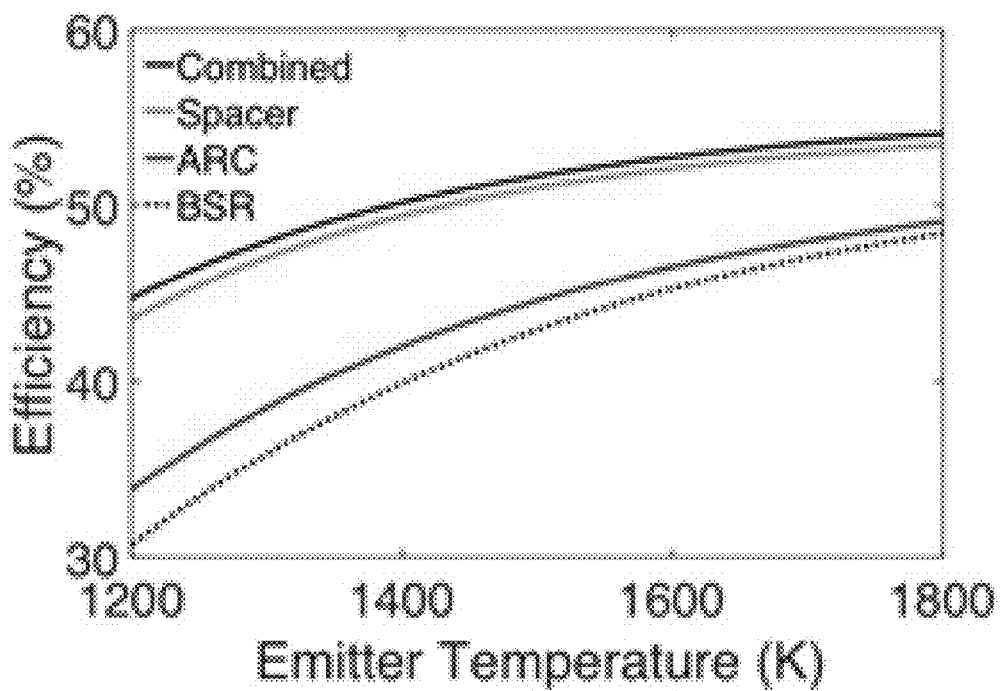
FIG. 5B depicts a comparison of the predicted efficiency for various thermophotovoltaic cells at various thermal emitter temperatures.

Table 1 highlights the fact that a reflective back surface (BSR) is needed to achieve high efficiency. The BSR structure is predicted to achieve 43% efficiency for a 1500 K emitter, whereas the Baseline structure achieves only 8% efficiency under these conditions. The use of a $MgF_2$ back-spacer further improves this efficiency gain. The Spacer structure is predicted to exhibit 8% greater (absolute) efficiency than the BSR structure because of its greater sub-bandgap reflectance (98.9% vs. 96.8%). The ARC Example, on the other hand, is less important for improving efficiency but improves the above-bandgap absorptance considerably. Consequently, the ARC structure exhibits 0.8 $W/cm^2$ higher power than the BSR and Spacer structures (See FIG. 5B).

Figure 5C:
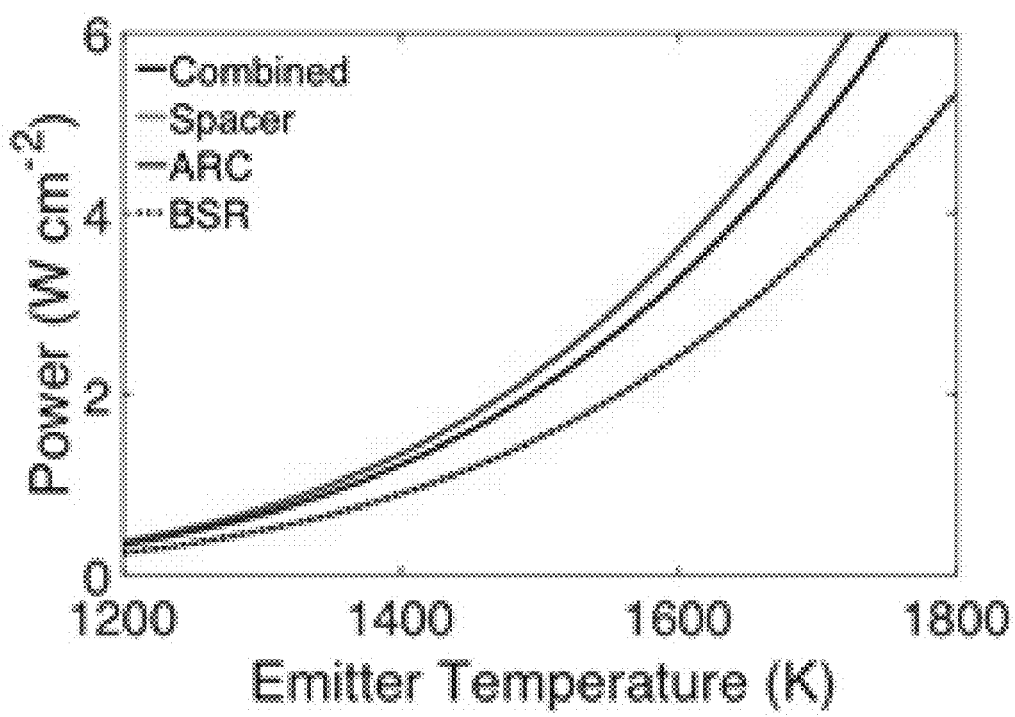
FIG. 5C depicts a comparison of the predicted output for various thermophotovoltaic cells at various thermal emitter temperatures.

Based on these insights, a TPV structure with an ARC and a back-spacer (see FIG. 5A), hereafter called "Combined". An optimized Combined structure exhibits strong spectral-selectivity (see FIG. 5A), achieving higher above-bandgap absorptance than the Spacer structure without compromising the sub-bandgap reflectance (see Table 1). Because of its superior optical properties, the Combined device is predicted to operate with higher efficiency than either the BSR or Spacer device (see FIG. 5B) and with a power output approaching that of the ARC device (see FIG. 5C). Based on the energy conversion model, an efficiency of 52% and a power output of 2.1 $W/cm^2$ for the Combined cell paired with a 1500 K emitter was predicted.

In summary, a strong spectral-selectivity in thin-film structures was demonstrated by using back-surface reflectors and by optimizing interference, with the potential to enable high-performance InGaAs TPV generators. Specifically, sub-bandgap reflectance can be further enhanced (to above 96%) using a dielectric spacer layer, potentially enabling efficiencies above 50%. To maintain high power density (~2 $W/cm^2$), a simple double-layer anti-reflection coating may be used. The potential for a dramatic increase of conversion efficiency through improved spectral-selectivity, combined with the potential for reduced module costs through wafer reuse, supports the prospect of thin-film TPVs for applications in distributed power generation. Beyond the optical challenges considered here, development of high-performance thin-film TPV systems will require precise doping of active materials and design of selective electrical contacts with low parasitic absorption.

InGaAs Film Growth

InGaAs structures were grown by gas-source molecular beam epitaxy. A 200 nm thick, unintentionally doped InP buffer layer was grown on a 2 inch diameter, Zn doped (100) InP wafer, followed by a 4 nm thick AlAs sacrificial layer,

TABLE 1

Optimized architecture and performance for several InGaAs structures ($T_h$ = 1500 K).

| Examples | ARC Layer $MgF_2$ [μm] | ARC Layer ZnSe [μm] | Active Layer InGaAs [μm] | Spacer Layer $MgF_2$ [μm] | BSR Layer | $\bar{a}(E \geq E_g)$ [%] | $\bar{a}(E < E_g)$ [%] | η [%] | $P_{out}$ [W cm$^{-2}$] |
|---|---|---|---|---|---|---|---|---|---|
| 1. "BSR" | — | — | 0.97 | — | Au | 60.8 | 3.2 | 42.9 | 1.52 |
| 2. "ARC" | 0.20 | 0.10 | 2.78 | — | Au | 92.2 | 3.7 | 44.6 | 2.27 |
| 3. "Spacer" | — | — | 1.1 | 0.44 | Au | 61.1 | 1.1 | 51.0 | 1.52 |
| 4. "Combined" | 0.46 | 0.15 | 1.46 | 0.42 | Au | 82.3 | 1.4 | 51.7 | 2.07 |
| 5. "Baseline" | * | * | 1.93 | — | Black | * | * | 8.1 | 2.32 |

* The Baseline structure is characterized by near perfect above-bandgap absorptance, although no ARC is specified.

and an unintentionally doped i-InGaAs absorption layer. The wafer was then diced into 6 mm×6 mm squares using an ADT7100 dicing saw. Samples were rinsed with DI water for 30 seconds to remove dicing residue and stored in acetone to prevent surface contamination. Immediately before further processing, samples were soaked in buffered HF for 1 minute and rinsed in DI water for 10 seconds to remove surface native oxides.

InGaAs with BSR Fabrication

Following InGaAs film growth, a 200 nm thick Au layer was deposited by electron beam evaporation on the epitaxial InGaAs surface. A 500 µm thick (100) B doped Si wafer was immersed in buffered HF for 1 minute and rinsed in DI water for 10 seconds to remove native oxides. A 5 nm thick Ir adhesion layer and a 200 nm thick Au layer were deposited on the Si wafer. The metalized surfaces of the sample and wafer were cold-weld bonded by applying heat (200° C.) and pressure (5 MPa) for 5 minutes under vacuum ($10^{-4}$ mTorr) using an EVG 520 wafer bonder. The epitaxial layers were lifted off from the parent InP wafer by removing the AlAs layer through immersion in 17% HF at 45° C. with 400 rpm agitation by magnetic stir bar for 1.5 hours. Following lift-off, samples were stored at 60° C. in Remover PG (MicroChem) to prevent oxide formation on the epitaxial surface prior to further processing.

ARC Fabrication

Following InGaAs with BSR fabrication, a ZnSe/MgF$_2$ bilayer anti-reflection coating was deposited onto the epitaxial InGaAs surface by electron beam evaporation.

InGaAs with back-spacer fabrication

Following InGaAs film growth, a 200 nm thick Au layer was deposited by electron beam evaporation on the epitaxial InGaAs surface. Similarly, a 5 nm thick Ir adhesion layer and a 200 nm thick Au layer were deposited on a 25 µm thick E-type Kapton foil substrate. The metalized surfaces of the sample and foil were cold-weld bonded by applying heat (200° C.) and pressure (5 MPa) for 5 minutes under vacuum ($10^{-4}$ mTorr) using an EVG 520 wafer bonder. The epitaxial layers were lifted off from the parent InP wafer by removing the AlAs layer through immersion in 17% HF at 45° C. with 400 rpm agitation by magnetic stir bar for 1.5 hours. Following lift-off by HF etch, MgF$_2$ was deposited onto the epitaxial InGaAs surface by electron beam evaporation, followed by a 200 nm thick Au layer. A 500 µm thick (100) B doped Si wafer was immersed in buffered HF for 1 minute and rinsed in DI water for 10 seconds to remove native oxides. A 5 nm thick Ir adhesion layer and a 200 nm thick Au layer were deposited on the Si wafer. The metalized surfaces of the sample and Si wafer were cold-weld bonded by applying heat (200° C.) and pressure (5 MPa) for 5 minutes under vacuum ($10^{-4}$ mTorr) using an EVG 520 wafer bonder. The Kapton host foil was removed by inductively coupled plasma (ICP) reactive-ion etching (RIE) (Oxford Plasmalab System 100) with 20 sccm of O$_2$ at a chamber pressure of 6 mTorr, stage temperature of 0° C., ICP power of 500 W, and forward power of 100 W for 25 minutes. The remaining Ir and Au layers were removed using ICP RIE with 12:9:5 sccm of H2:Cl2:Ar at a chamber pressure of 10 mTorr, stage temperature of 0° C., ICP power of 500 W, and forward power of 100 W for 2.5 minutes.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

What is claimed is:

1. A thermophotovoltaic (TPV) cell comprising:
    an active layer comprising indium gallium arsenide and no antimonide or only trace levels of antimonide;
    a back-surface reflective (BSR) layer; and
    a spacer layer positioned between the active layer and back-surface reflective layer,
    wherein the TPV cell has an average reflectance in a range of 94% to 99% below a bandgap of the TPV cell, as averaged across a spectral range below the bandgap, wherein the spectral range is from the bandgap to 4 microns, and
    wherein no growth substrate or lateral conduction layer is positioned between the spacer layer and the active layer.

2. The TPV cell of claim 1, further comprising:
    an anti-reflective coating (ARC) layer,
    wherein the active layer is positioned between the ARC layer and the spacer layer.

3. The TPV cell of claim 2, wherein the ARC layer comprises a plurality of layers.

4. The TPV cell of claim 3, wherein a first layer of the plurality of layers comprises magnesium fluoride, and a second layer of the plurality of layers comprises zinc selenide.

5. The TPV cell of claim 1, wherein the BSR layer comprises gold.

6. The TPV cell of claim 1, wherein the spacer layer comprises magnesium fluoride.

7. The TPV cell of claim 1, wherein a thickness of the spacer layer is in a range of 0.01-1 micrometers.

8. The TPV cell of claim 1, wherein a thickness of the active layer is in a range of 0.01-10 micrometers.

9. The TPV cell of claim 1, further comprising:
    an adhesion layer,
    wherein the adhesion layer is configured to adhere the BSR layer to a substrate such that BSR layer is positioned between the spacer layer and the substrate.

10. The TPV cell of claim 9, wherein the adhesion layer comprises iridium, platinum, or titanium.

11. The TPV cell of claim 1, wherein the TPV cell has a conversion efficiency in a range of 45-52%.

12. The TPV cell of claim 11, wherein the conversion efficiency is in a range of 50-52%.

13. A thermophotovoltaic (TPV) cell comprising:
    an active layer comprising a direct bandgap semiconductor composition;
    a back-surface reflective (BSR) layer; and
    a spacer layer positioned between the active layer and back-surface reflective layer,
    wherein the TPV cell is configured to have an average reflectance in a range of 94% to 99% below a bandgap of the TPV cell, as averaged across a spectral range below the bandgap, wherein the spectral range is from the bandgap to 4 microns, and
    wherein no growth substrate or lateral conduction layer is positioned between the spacer layer and the active layer.

14. The TPV cell of claim 13, wherein the active layer comprises indium gallium arsenide and no antimonide or only trace levels of antimonide.

15. The TPV cell of claim 13, further comprising:
an anti-reflective coating (ARC) layer,
wherein the active layer is positioned between the ARC layer and the spacer layer.

16. The TPV cell of claim 15, wherein the ARC layer comprises a plurality of layers,
wherein a first layer of the plurality of layers comprises magnesium fluoride, and a second layer of the plurality of layers comprises zinc selenide.

17. The TPV cell of claim 13, wherein the spacer layer comprises magnesium fluoride.

18. The TPV cell of claim 13, wherein the spacer layer has a refractive index of less than 3.5.

19. The TPV cell of claim 2, wherein a thickness of the ARC layer is in a range of 0.1-1 micrometers,
wherein the thickness of the active layer is in a range of 0.01-10 micrometers, and
wherein a thickness of the spacer layer is in a range of 0.01-1 micrometers.

20. The TPV cell of claim 1, wherein the average reflectance is an average weighted reflectance.

21. The TPV cell of claim 1, wherein the average reflectance is in a range of 97-99%.

22. The TPV cell of claim 1, wherein the TPV cell has a power output in a range of 1.8-2.1 W/cm$^2$.

23. The TPV cell of claim 13, wherein the active layer has no antimonide or only trace levels of antimonide.

24. The TPV cell of claim 13, wherein the direct bandgap semiconductor composition comprises gallium antimonide (GaSb), indium arsenide (InAs), gallium arsenide (GaAs), indium phosphide (InP), indium gallium arsenide antimonide (InGaAsSb), indium gallium arsenide (InGaAs), indium phosphide arsenide antimonide (InPAsSb), or indium gallium arsenide phosphide (InGaAsP).

25. The TPV cell of claim 13, wherein the direct bandgap semiconductor composition comprises indium arsenide (InAs), gallium arsenide (GaAs), indium phosphide (InP), indium gallium arsenide (InGaAs), or indium gallium arsenide phosphide (InGaAsP).

26. The TPV cell of claim 13, wherein the average reflectance is in a range of 95% to 99%.

* * * * *